United States Patent
Totani (10) Patent No.: US 10,249,799 B2
(45) Date of Patent: Apr. 2, 2019

(54) METHOD FOR PRODUCING LIGHT-EMITTING DEVICE

(71) Applicant: TOYODA GOSEI CO., LTD., Kiyosu-shi (JP)

(72) Inventor: Shingo Totani, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/803,469

(22) Filed: Nov. 3, 2017

(65) Prior Publication Data

US 2018/0145227 A1 May 24, 2018

(30) Foreign Application Priority Data

Nov. 24, 2016 (JP) .................. 2016-227534

(51) Int. Cl.
| | | |
|---|---|---|
| *H01L 33/00* | (2010.01) | |
| *H01L 21/28* | (2006.01) | |
| *H01L 33/44* | (2010.01) | |
| *H01L 33/38* | (2010.01) | |
| *H01L 33/40* | (2010.01) | |
| *H01L 33/32* | (2010.01) | |
| *H01L 33/42* | (2010.01) | |

(52) U.S. Cl.
CPC ........ *H01L 33/405* (2013.01); *H01L 33/0075* (2013.01); *H01L 33/32* (2013.01); *H01L 33/387* (2013.01); *H01L 33/42* (2013.01); *H01L 33/44* (2013.01)

(58) Field of Classification Search
CPC ..... H01L 33/38; H01L 33/44; H01L 33/0025; H01L 33/06; H01L 33/24; H01L 2224/13; H01L 2224/48091; H01L 2224/73265; H01L 2924/00014; H01L 2224/05022; H01L 2224/05568; H01L 2224/05001; H01L 2224/05124

See application file for complete search history.

(56) References Cited

U.S. PATENT DOCUMENTS

| | | | |
|---|---|---|---|
| 7,615,794 B2 | 11/2009 | Katsuno et al. | |
| 2009/0050916 A1 | 2/2009 | Katsuno et al. | |
| 2010/0051987 A1* | 3/2010 | Katsuno ................. | H01L 33/38 257/98 |
| 2012/0264307 A1* | 10/2012 | Kundalgurki ..... | H01L 21/02057 438/705 |

FOREIGN PATENT DOCUMENTS

JP  2009-049266 A  3/2009

* cited by examiner

*Primary Examiner* — Brian Turner (74) *Attorney, Agent, or Firm* — McGinn IP Law Group, PLLC (57) ABSTRACT

A transparent electrode is formed on a region for forming a reflective electrode later on the p-type layer. Subsequently, a part of the surface of the p-type layer is dry etched to expose the n-type layer. On the p-type layer and the n-type layer exposed in the previous step, a resist layer with an opening is formed through photolithography. The opening has a pattern in which the center of the transparent electrode is exposed and the ends of the opening are covered with the resist layer. Next, the transparent electrode is wet etched. A reflective film is formed on the p-type layer and the resist layer, to remove the resist layer. Thus, only the reflective film on the p-type layer is left to form a reflective electrode. Then, a cover metal layer is continuously formed over the reflective electrode and the transparent electrode.

5 Claims, 6 Drawing Sheets

METHOD FOR PRODUCING LIGHT-EMITTING DEVICE

BACKGROUND OF THE INVENTION

Filed of the Invention

The present invention relates to a method for producing a Group III nitride semiconductor light-emitting device having a reflective electrode on a p-type layer.

Background Art

In a flip-chip type Group III nitride semiconductor light-emitting device, an electrode (reflective electrode) serving as a reflective film is formed on a p-type layer to reflect light toward the rear surface of a substrate, thereby improving the light extraction efficiency. Ag or Ag alloy is widely used for the reflective electrode.

Ag is a material easy to cause migration. It is known that the reflective electrode is prevented from coming into contact with moisture by covering with a cover metal, thereby suppressing migration.

Japanese Patent Application Laid-Open (kokai) No. 2009-49266 discloses a light-emitting device having a first metal film made of Ag on the p-type layer, a dielectric film provided apart from the first metal film on the p-type layer, and a second metal film made of a metal not containing Ag, which covers the top of the first metal film, the dielectric film, and the p-type layer exposed between the first metal film and the dielectric film. The first metal film is covered with the second metal film so that the first metal film is isolated from the atmosphere, thereby preventing migration.

However, the cover metal is formed so as to cover the reflective electrode so that the cover metal is in contact with the p-type layer in the vicinity of the ends of the reflective electrode. The problem is that light extraction efficiency is deteriorated because light is absorbed by the cover metal at the ends.

SUMMARY OF THE INVENTION

In view of the foregoing, an object of the present invention is to improve the light extraction efficiency in a light-emitting device having a reflective electrode on a p-type layer.

The present invention relates to a method for producing a Group III nitride semiconductor light-emitting device having a reflective electrode on a p-type layer, the method comprising:

a light transmitting film formation step of forming a light transmitting film made of a transparent material having a refractive index different from that of the p-type layer on a region for forming a reflective electrode later on the p-type layer;

a resist layer formation step of forming a resist layer with an opening on the p-type layer and the light transmitting film, and exposing the surface of the light transmitting film in the bottom of the opening;

a light transmitting film removal step of removing the center of the light transmitting film by wet etching, and leaving the ends of the light transmitting film to form a ring-shaped light-transmitting film;

a reflective film formations step of forming a reflective film containing Ag or Ag alloy on the p-type layer and the resist layer;

a reflective electrode formation step of forming the reflective electrode by removing the resist layer along with the reflective film on the resist layer to leave the reflective film on the p-type layer; and a cover metal layer formation step of forming a cover metal layer on the reflective electrode and the ring-shaped light transmitting film.

The light transmitting film is made of any material as long as it is a transparent material having a refractive index different from that of the p-type layer, and a transparent electrode or an insulating film may be employed. By using the transparent electrode, the contact resistance with the p-type layer can be further reduced, thereby reducing the driving voltage. By using the insulating film, the difference in refractive index from the p-type layer is made larger, and more light can be reflected at an interface between the p-type layer and the insulating film, thereby further reducing the light absorption by the cover metal layer.

When the ring-shaped light transmitting film is a ring-shaped transparent electrode, the ring-shaped transparent electrode and the reflective electrode may be in contact with each other with no space. The light absorption by the cover metal layer can be reduced because the cover metal layer does not come into contact with the p-type layer.

When the ring-shaped light transmitting film is a ring-shaped insulating film, a space may be provided between the ring-shaped insulating film and the reflective electrode. This can prevent peeling of the reflective electrode.

Dry etching is preferably performed to expose the n-type layer for forming an n-electrode before the resist layer formation step after the light transmitting film formation step. It is because no restriction is imposed on the type of resist stripper or the post treatment method such as heat treatment and asking after resist removal with respect to a resist mask used for dry etching.

According to the present invention, the cover metal layer does not come into contact with the p-type layer in the vicinity of the ends of the reflective electrode by forming a light transmitting film. Light can be reflected at an interface between the p-type layer and the light transmitting film. As a result, the rate of light absorption by the cover metal layer is reduced, thereby improving the light extraction efficiency.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

A specific embodiment of the present invention will next be described with reference to the drawings. However, the present invention is not limited to the embodiments.

Embodiment 1

Figure 1:
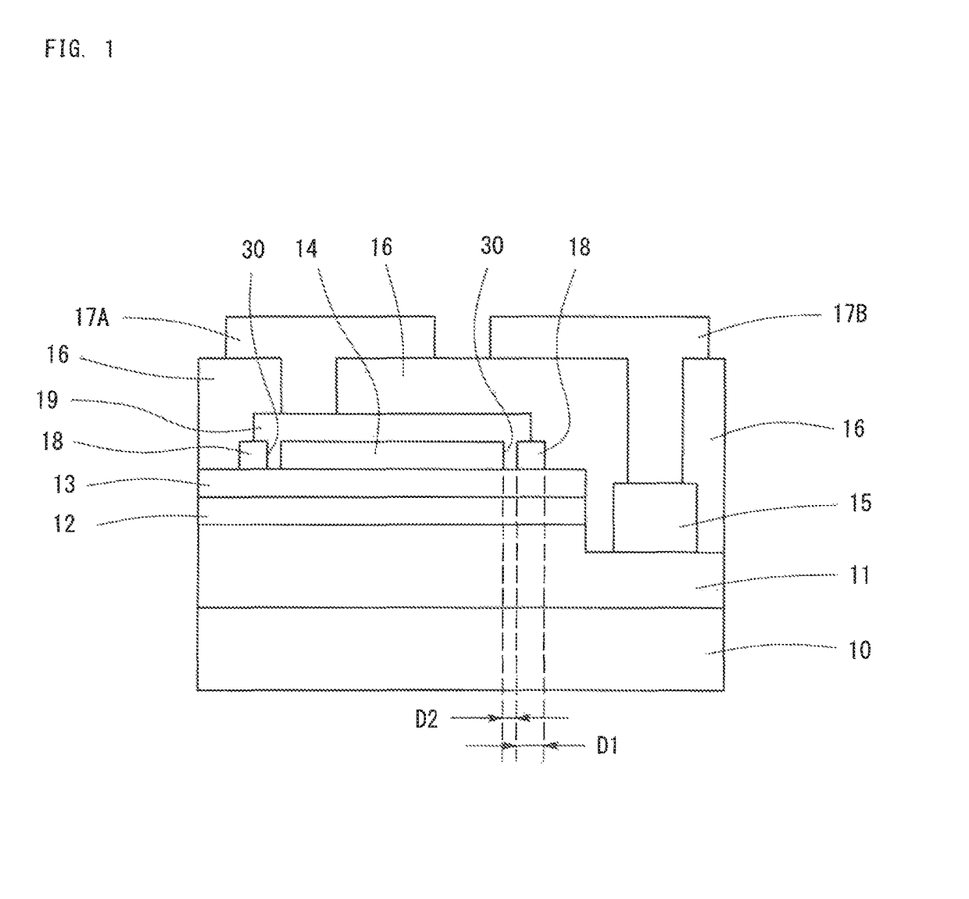
FIG. 1 is a sketch showing the structure of a light-emitting device according to Embodiment 1.

FIG. 1 is a sketch showing the structure of a light-emitting device according to Embodiment 1. As shown in FIG. 1, the light-emitting device according to Embodiment 1 comprises a substrate 10, an n-type layer 11, a light-emitting layer 12, and a p-type layer 13 sequentially deposited via a buffer layer (not illustrated) on the substrate 10, a reflective electrode 14 formed on the p-type layer 13, a transparent electrode 18 having a ring shape (corresponding to a ring-shaped light transmitting film or a ring-shaped transparent electrode of the present invention) formed so as to enclose the reflective electrode 14 on the p-type layer 13, a cover metal layer 19 formed on the reflective electrode 14 and the transparent electrode 18, an n-electrode 15, a protective film 16, and junction electrodes 17A and 17B. The light-emitting device according to Embodiment 1, is a flip-chip type device which extracts light from the rear surface of the substrate 10 (the surface opposite to the surface in contact with the n-type layer 11).

The substrate 10 is a growth substrate for forming a Group III nitride semiconductor on the main surface thereof. The surface on the n-type layer 11 side of the substrate 10 has an uneven structure, thereby improving the light extraction efficiency. The substrate 10 may be made of a material other than sapphire, such as Si, GaN, SiC, and ZnO.

The n-type layer 11, the light-emitting layer 12, and the p-type layer 13 may have any structure conventionally employed as the structure of a light-emitting device. For example, the n-type layer 11 has a structure in which an n-type contact layer made of n-GaN, an electrostatic breakdown preventing layer formed by sequentially depositing undoped GaN and n-GaN, and an n-type superlattice layer formed by alternately and repeatedly depositing n-GaN and InGaN, are sequentially deposited. The light-emitting layer 12 has a MQW structure in which a plurality of layer units are repeatedly deposited, each layer unit comprising an InGaN well layer, a cap layer made of GaN or AlGaN, and an AlGaN barrier layer sequentially deposited. The p-type layer 13 has a structure in which a p-type cladding layer formed by alternately and repeatedly depositing p-AlGaN and p-InGaN, and a p-type contact layer made of p-GaN are sequentially deposited.

On a part of the surface of the p-type layer 13, a trench having a depth reaching the n-type layer 11 is formed. The trench exposes the surface of the n-type layer 11 to form an n-electrode 15.

The reflective electrode 14 is formed on a region except the ends on the p-type layer 13. The reflective electrode 14 has a layered structure of Ag alloy/Al. Ag alloy refers to an alloy containing Ag as a main constituent element. The symbol "/" means depositing, and A/B means a layered structure in which a layer of A is first formed and a layer of B is then formed. The symbol "/" will be used in the same meaning in the description of materials provided below. The layers of the reflective electrode 14 have thicknesses of 100 nm and 1 nm respectively in the deposition order.

The structure or material of the reflective electrode 14 is not limited to the above, and any material and structure may be employed. For example, the reflective electrode 14 of Embodiment 1 is a layered film, but it may be a single layer or a single layer of Ag or Ag alloy. In Embodiment 1, Ag alloy difficult to wet etch may be used, for example, an Ag alloy containing Au may be used because no restriction is imposed on the types of Ag alloy.

When the reflective electrode 14 is a layered film, the lowest layer (layer in contact with the p-type layer 13) may be a Ni film. Thereby, the contact resistance between the reflective electrode 14 and the p-type layer 13 can be further reduced.

The transparent electrode 18 is formed on the p-type layer 13, and has a large opening at the center thereof so that only the ends remain in a ring-shape. In the opening, the surface of the p-type layer 13 is exposed, and the reflective electrode 14 is formed on the p-type layer 13 of the opening. There is a space 30 between a side surface of the reflective electrode 14 and a side surface of the transparent electrode 18. That is, the transparent electrode 18 is formed on the p-type layer so as to enclose the reflective electrode 14 along its outer circumference.

The transparent electrode 18 is made of ITO (Indium Tin Oxide) and has a thickness of 100 nm. Other than ITO, a transparent conductive oxide such as IZO (Indium Zinc Oxide), ICO (Indium-Cerium-Oxide), and ZnO, and a transparent conductive material having a refractive index different from that of the p-type layer 13 may be employed. As used herein, "transparent" means optically transparent to emission wavelength. When the p-type layer 13 comprises a plurality of layers, the layer in contact with the transparent electrode 18 of the p-type layer 13 may have a refractive index different from that of the transparent electrode 18.

The thickness of the transparent electrode 18 is not limited to 100 nm. However, the thickness of the transparent electrode 18 is preferably 50 nm or more to efficiently reflect light and establish a good contact with the p-type layer 13. Moreover, the thickness of the transparent electrode 18 is preferably 1,000 nm or less to facilitate the production of the light-emitting device. The thickness of the transparent electrode 18 may be an odd-number of $\lambda/(4n)$ to more efficiently reflect light. As used herein, $\lambda$ is an emission wavelength of the light-emitting device, and n is a refractive index of the transparent electrode 18. For example, when the emission wavelength is 400 nm, the refractive index of ITO is 2.0. Therefore, the thickness of the transparent electrode 18 may be an odd-number of 50 nm.

The opening and the ring-shape of the transparent electrode 18 may have any pattern, for example, a rectangle, a square, a polygon, a circle, an ellipse or a closed curved line. The transparent electrode 18 with the ring-shape may be continuous or divided into several parts along the circumferential direction. In the embodiment the transparent electrode 18 is a rectangular ring shape. The pattern is preferably such that the width D1 of the ring of the transparent electrode 18 is 6 μm or less to make the area of the reflective electrode 14 as large as possible. When the width D1 is small, the cover metal layer 19 may protrude outward to come into contact with the p-type layer 13. Therefore, the width D1 is 2 μm or more, more preferably, 3 μm to 5 μm, and further preferably, 3 μm to 4 μm.

The cover metal layer 19 is continuously formed on the reflective electrode 14, the transparent electrode 18 and the p-type layer 13, and is filled into the space 30 between the reflective electrode 14 and the transparent electrode 18. The cover metal layer 19 comprises Ni/Ti/Au/Al. The thicknesses of the layers are 100 nm, 100 nm, 1500 nm, and 10 nm respectively in the deposition order. The reflective electrode 14 is covered with the cover metal layer 19 so that the reflective electrode 14 is prevented from coming into contact with moisture, thereby suppressing the occurrence of migration of the reflective electrode 14. The material or thickness of the cover metal layer 19 is not limited to the above. Any material may be used as long as it hardly causes migration.

In Embodiment 1, the space 30 is provided between a side surface of the reflective electrode 14 and a side surface of the transparent electrode 18. However, the reflective electrode 14 may come into contact with the transparent electrode 18 with no space therebetween. In this case, the p-type layer 13 does not come into contact with the cover metal layer 19 via the space, and light absorption by the cover metal layer 19 can be further reduced. When the space 30 is provided, the width D2 of the space 30 is preferably 2 μm or less.

Figure 5:
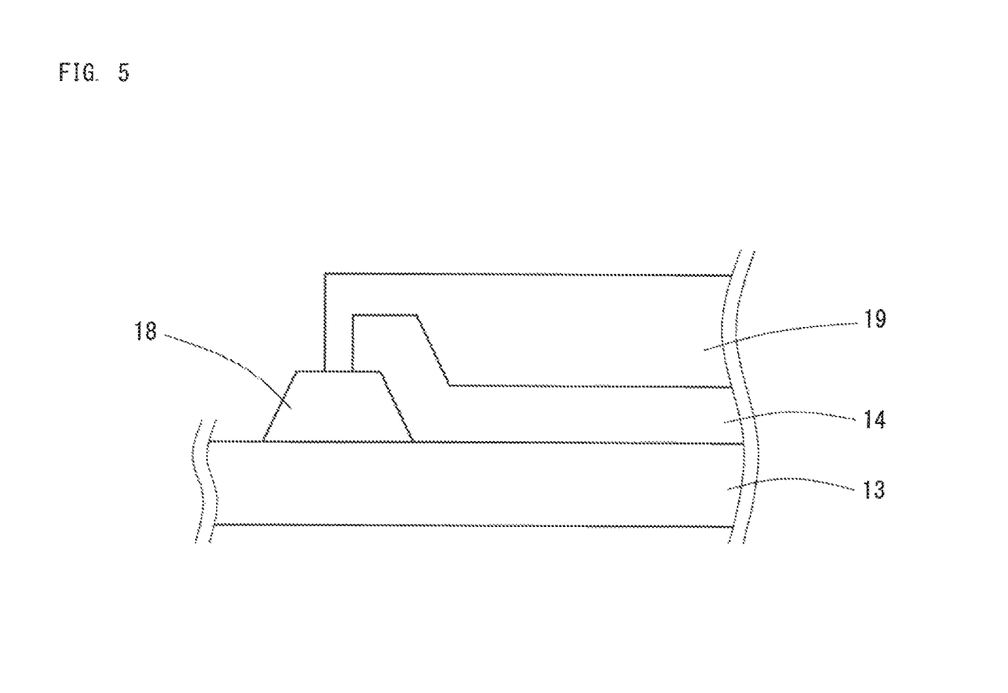
FIG. 5 is a sketch showing a variation of the structure of a reflective electrode.

As shown in FIG. 5, the reflective electrode 14 may be continuously formed from on the p-type layer 13 to the side surface of the transparent electrode 18, and further on the transparent electrode 18. In this case, the reflective electrode 14 may come into contact with the transparent electrode 18 with no space therebetween. Since the cover metal layer 19 is not in contact with the p-type layer 13 via the space, the light absorption by the cover metal layer 19 can be further reduced. Moreover, the area of the reflective electrode 14 can be made larger, and the area for reflecting light can be made larger. The reflective electrode 14 can more easily come into contact with the transparent electrode 18 by inclining the side surfaces of the transparent electrode 18 as shown in FIG. 5.

The n-electrode 15 is formed on the n-type layer 11 exposed in the bottom of the trench. The n-electrode 15 comprises Ti/Al/Ti/Au/Al, and the thicknesses of the layers are 1 nm, 100 nm, 100 nm, 1500 nm, and 10 nm respectively in the deposition order.

The protective film 16 is continuously formed over the reflective electrode 14, the n-type layer 11, and the n-electrode 15 so as to cover the entire top surface of the device. The protective film 16 is made of $SiO_2$, and has a thickness of 300 nm.

The junction electrodes 17A and 17B are formed apart from each other on the protective film 16. The protective film 16 has through holes passing through the protective film 16. Through the holes, the junction electrodes 17A is connected with the reflective electrode 14 via the cover metal layer 19, and the junction electrodes 17B is connected with the n-electrode 15. Each of the junction electrodes 17A and 17B comprise Ti/AuSn/Au, and the thicknesses of the layers are 100 nm, 3000 nm, and 50 nm respectively in the deposition order.

Next, a method for producing the light-emitting device according to Embodiment 1 will be described with reference to FIGS. 2A to 4C.

(Semiconductor Layer Formation Step)

Figure 2A:
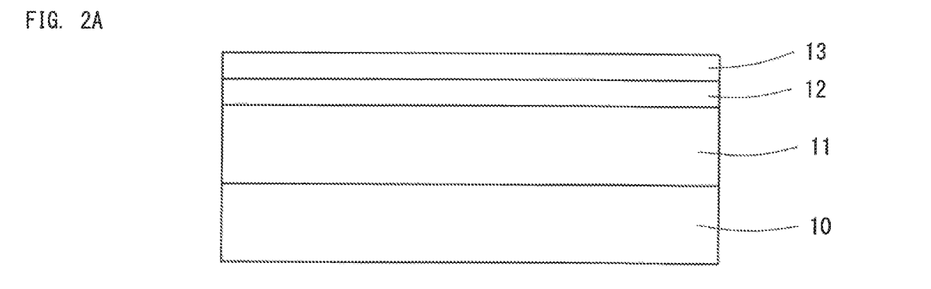
FIGS. 2A to 2C are sketches showing processes for producing a light-emitting device according to Embodiment 1.

Firstly, on the substrate 10, through MOCVD (Metal Organic Chemical Vapor Deposition), a buffer layer (not illustrated), an n-type layer 11, a light-emitting layer 12, and a p-type layer 13 are sequentially deposited (refer to FIG. 2A). In MOCVD, the following raw material gases are employed: ammonia ($NH_3$) as a nitrogen source; trimethylgallium ($Ga(CH_3)_3$: TMG) as a Ga source; trimethylindium ($In(CH_3)_3$: TMI) as an In source; trimethylaluminum ($Al(CH_3)_3$: TMA) as an Al source; silane ($SiH_4$) as an n-type doping gas; bis(cyclopentadienyl)magnesium ($Mg(C_5H_5)_2$: $CP_2Mg$) as a p-type doping gas; and $H_2$ and $N_2$ as carrier gases.

(Transparent Film Formation Step)

Subsequently, an ITO film is uniformly formed on an entire surface of the p-type layer 13 by sputtering. The ITO film is patterned by forming a resist mask through photolithography, and wet etching using Ferric Chloride ($FeCl_3$). Thus, a transparent film 180 having a rectangular shape (corresponding to the light transmitting film of the present invention) made of ITO having a thickness of 100 nm is formed on a region for forming a reflective electrode 14 later on the p-type layer 13 (refer to FIG. 2B). The transparent electrode 18 is patterned by forming a resist mask through photolithography, and wet etching using Ferric Chloride ($FeCl_3$). The transparent film 180 is a layer for protecting the resist from being in contact with the region for forming the reflective electrode 14 on the surface of the p-type layer 13, and a layer for protecting the cover metal layer 19 from being in contact with the p-type layer 13 at the end of the reflective electrode 14. The transparent film 180 may be formed by vapor deposition other than sputtering. The transparent film 180 may be patterned through lift-off. However, patterning is preferably performed by wet etching as in Embodiment 1. Through lift-off, the resist may come into contact with a region of the surface of the p-type layer 13 where the reflective electrode 14 is formed, the residue of resist may occur, causing the increase of the contact resistance between the reflective electrode 14 and the p-type layer 13.

(n-Type Layer Exposure Step)

Figure 2B:
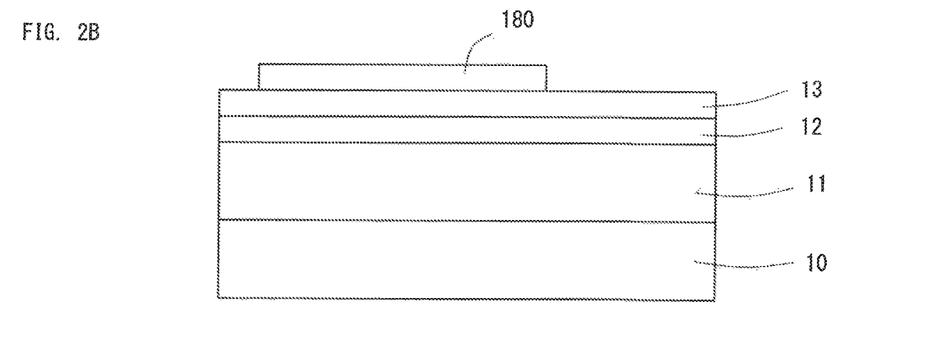
Figure 2C:
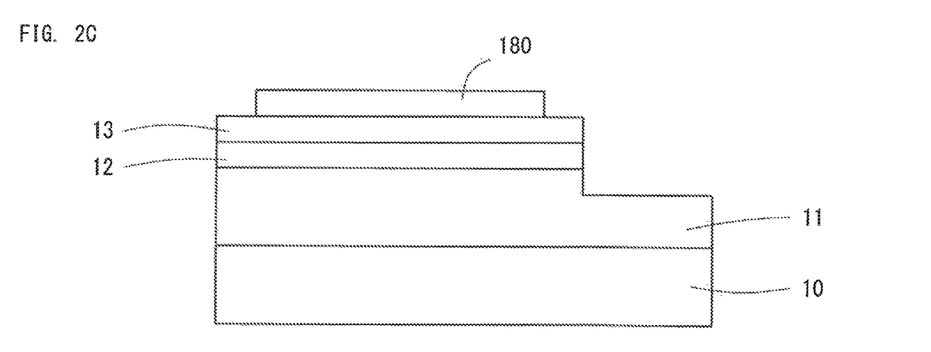

Next, a part of the surface of the p-type layer 13 is dry etched to expose the n-type layer 11 (refer to FIG. 2C). In the dry etching, the resist formed through photolithography is used as a mask, and the transparent film 180 is formed on a prescribed region on the p-type layer 13. Therefore, the surface of the p-type layer 13 below the transparent film 180 does not come into contact with the resist so that it can be kept clean.

(Resist Layer Formation Step)

Figure 3A:
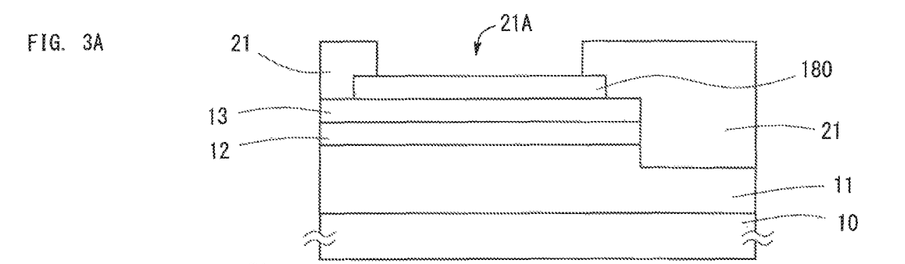
FIGS. 3A to 3E are sketches showing processes for producing a light-emitting device according to Embodiment 1.
Figure 3B:
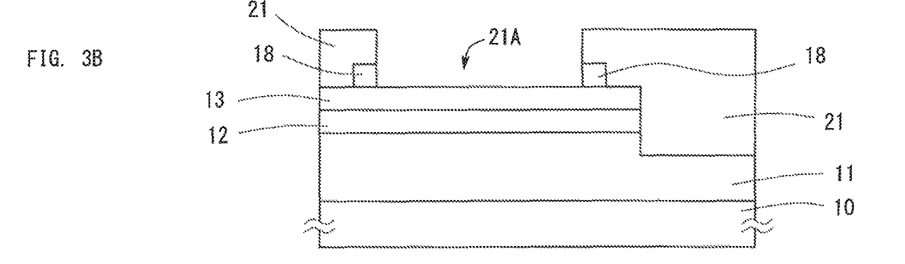

Next, a resist layer 21 having an opening 21A is formed through photolithography on the p-type layer 13 and the n-type layer 11 exposed in the previous step (refer to FIG. 3A). In this case, the surface of the p-type layer 13 below the transparent film 180 does not come into contact with the resist so that it can be kept clean. The opening 21A has a pattern that the center of the surface of the transparent film 180 is exposed and the ends of the transparent film 180 are covered in the ring shape with the resist layer 21.

The resist is made of, for example, positive inversion type resist such as AZ5214 (made by AZ Electronic Materials Ltd.) or AZ5200NJ (made by AZ Electronic Materials Ltd.). Needless to say, the resist material is not limited to these, any material may be used as long as it has a resistance to the wet etching solution for the transparent film 180 in the subsequent step.

After patterning of the resist layer 21, a thin resist is left on the transparent film 180 in some cases. After patterning the resist layer 21, photo-excited asking is preferably performed to remove the resist on the transparent film 180. Thus, variation is eliminated in wet etching the transparent film 180 in the subsequent step, and the transparent film 180 can be accurately removed.

(Transparent Film Removal Step)

The transparent film 180 is wet etched using ferric chloride. A region where the resist layer 21 is formed on the transparent film 180 is left in the ring shape without side etching (refer to FIG. 3B). The etching solution is not limited to ferric chloride. Any etching solution may be used as long as it can etch only the transparent film 180 without etching the resist layer 21. For example, an acid-based etching solution may be used. Through the wet etching, the center of the transparent film 180 is opened and removed, and only the ends are left in the ring shape. That is, the transparent electrode 18 is formed in a rectangular ring shape. The transparent electrode 18 with the ring shape may be continuous or divided into several parts along the circumferential direction. In the opening of the transparent electrode 18, the surface of the p-type layer 13 is exposed, and the surface is a clean surface with which the resist has not come into contact.

Figure 6:
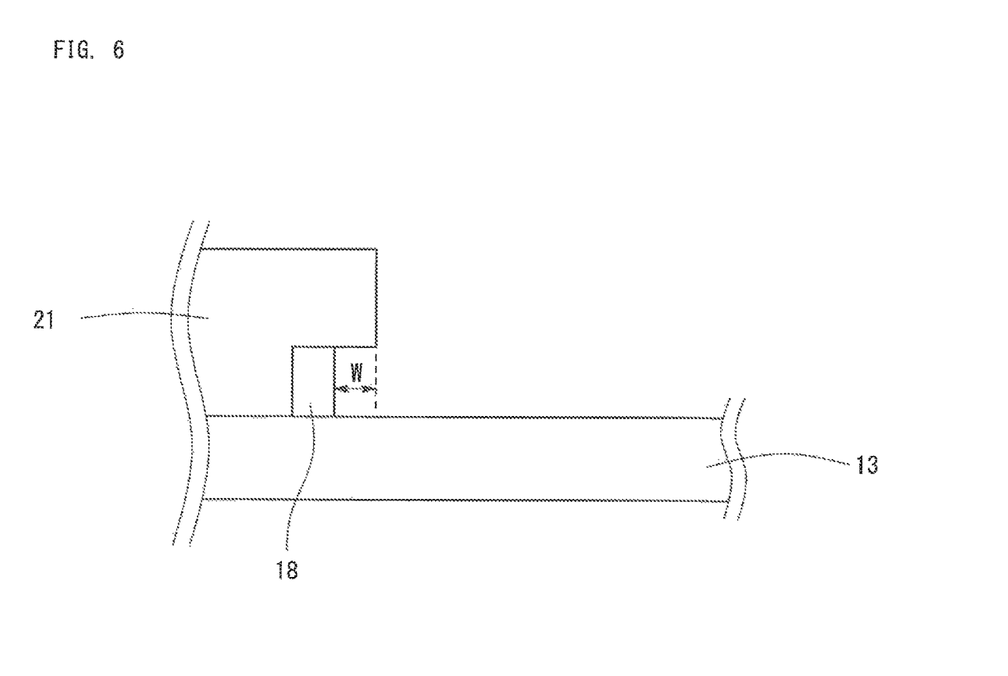
FIG. 6 is a sketch showing wet etching of a transparent film.

As long as the ends of the transparent film 180 are left, the transparent electrode 18 below the resist layer 21 may be side etched as shown in FIG. 6. However, the side etching width W is too large, the space 30 between the reflective electrode 14 and the transparent electrode 18 is widened, and the area of the cover metal layer 19 in contact with the p-type layer 13 in the space 30 is also enlarged. Therefore, the side etching width W is preferably 0 μm to 2 μm.

As shown in FIG. 5, in order to continuously form the reflective electrode 14 over the p-type layer 13 to the side surface of the transparent electrode 18 or to the transparent electrode 18, the side surfaces of the transparent electrode 18 may be wet etched so as to have a forward tapered shape, and in the subsequent reflective film 22 formation step, the reflective film 22 may be formed so as to wrap the top of the transparent electrode 18. The wrapping width is about 1 μm to 4 μm, and the transparent electrode 18 may be side etched in this width range.

(Reflective Film Formation Step)

Figure 3C:
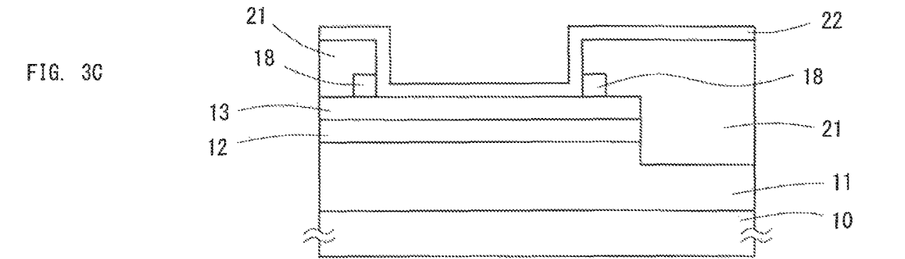

Next, a reflective film 22 is formed by sputtering on the p-type layer 13 and the resist layer 21 (refer to FIG. 3C). Vapor deposition may be used other than sputtering. The surface being exposed of the p-type layer 13 is a region where the transparent film 180 was formed, and is a clean surface with which the resist has not come into contact. Therefore, the surface of the p-type layer 13 in contact with the reflective film 22 is a clean surface.

(Reflective Electrode Formation Step)

Next, the resist layer 21 is removed using a resist stripper. The reflective film 22 on the resist layer 21 is removed, and only the reflective film 22 on the p-type layer 13 is left to form the reflective electrode 14 (refer to FIG. 3D). Through the above, the reflective electrode 14 is formed on the clean p-type layer 13 with which the resist has not come into contact. Thereafter, heat treatment may be performed to reduce the contact resistance as needed.

(Cover Metal Layer Formation Step)

Subsequently, a cover metal layer 19 is continuously formed through vapor deposition on the reflective electrode 14 and the transparent electrode 18. At this time, the space 30 is filled with the cover metal layer 19 (refer to FIG. 3E). Patterning is performed through lift-off. Thus, the reflective electrode 14 is covered with the cover metal layer 19, and is blocked from the outside, thereby suppressing migration of the reflective electrode 14. The transparent electrode 18 is disposed in the vicinity of the ends of the reflective electrode 14. Therefore, except the space 30 between the reflective electrode 14 and the transparent electrode 18, the cover metal layer 19 is not in contact with p-type layer 13 so that the transparent electrode 18 is disposed between the cover metal layer 19 and the p-type layer 13.

(n-Electrode Formation Step)

Figure 4A:
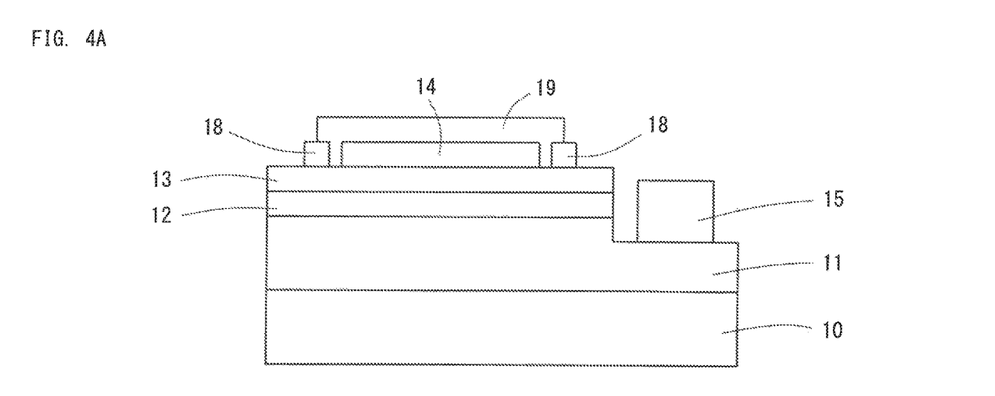
FIGS. 4A to 4C are sketches showing processes for producing a light-emitting device according to Embodiment 1.
Figure 4B:
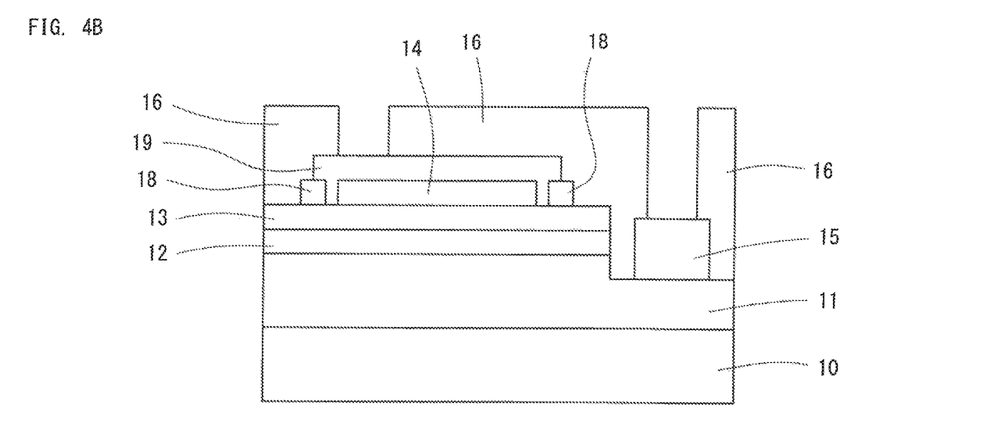
Figure 4C:
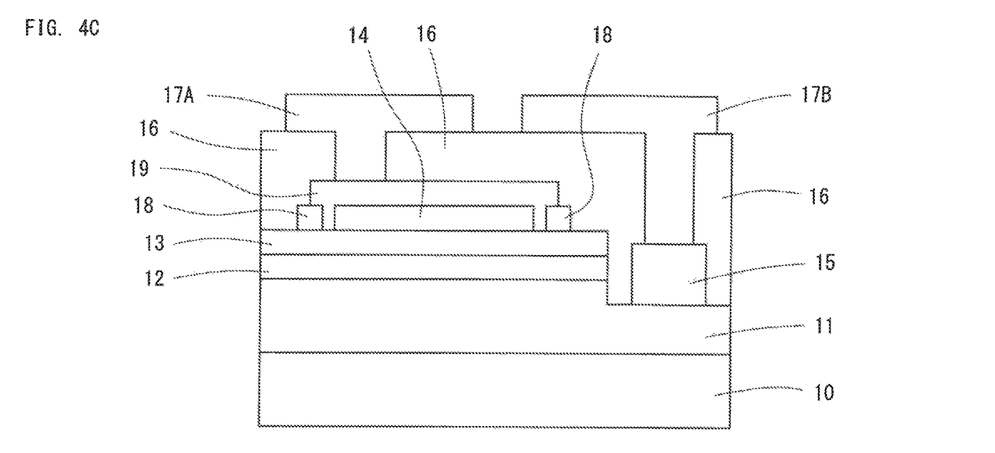

Next, an n-electrode 15 is formed by sputtering on the n-type layer 11 exposed by etching in the bottom of the trench, (refer to FIG. 4A). The n-electrode 15 is patterned through lift-off.

(Protective Film Formation Step)

Subsequently, a protective film 16 having a thickness of 300 nm is formed on the entire top surface of the light-emitting device through CVD (Chemical Vapor Deposition). That is, the protective film 16 is continuously formed over the cover metal layer 19, the transparent electrode 18, the p-type layer 13, the n-type layer 11, and the n-electrode 15. Holes are formed in an individual part of the protective film 16, to expose the respective parts of the cover metal layer 19 and the respective parts of the n-electrode 15 in the bottom of the hole (refer to FIG. 4B). The holes are formed by forming a resist mask through photolithography and wet etching using a buffered hydrofluoric acid.

(Junction Electrode Formation Step)

Next, a junction electrode 17A and a junction electrode 17B are formed apart from each other on the protective film 16. The junction electrode 17A is contacted with the cover metal layer 19 exposed in the bottoms of the holes of the protective film 16. The junction electrode 17B is contacted with the n-electrode 15 exposed in the bottoms of the holes of the protective film 16 (refer to FIG. 4C). Film formation is carried out through vapor deposition, and patterning is performed through lift-off. Through the above, the light-emitting device according to Embodiment 1 is produced.

In the light-emitting device according to Embodiment 1, the area of the cover metal layer 19 in contact with the p-type layer 13 in the vicinity of the ends of the reflective electrode 14 can be reduced by forming the transparent electrode 18 in the vicinity of the ends of the reflective electrode 14, so that light can be reflected at an interface between the transparent electrode 18 and the p-type layer 13. Thus, light reaching the cover metal layer 19 is decreased, and light absorption by the cover metal layer 19 is reduced, thereby improving the light extraction efficiency. The transparent electrode 18 has a lower contact resistance to the p-type layer 13 than to the cover metal layer 19 so that the contact resistance is reduced as a whole, thereby reducing the driving voltage.

In the method for producing a light-emitting device according to Embodiment 1, the reflective electrode 14 can be formed on the p-type layer 13 without bringing the resist into contact with a region for forming the reflective electrode 14 on the surface of the p-type layer 13 is formed. Therefore, the increase of the contact resistance between the p-type layer 13 and the reflective electrode 14 can be suppressed without causing the residue of resist on the surface of the p-type layer 13.

Embodiment 2

Figure 7:
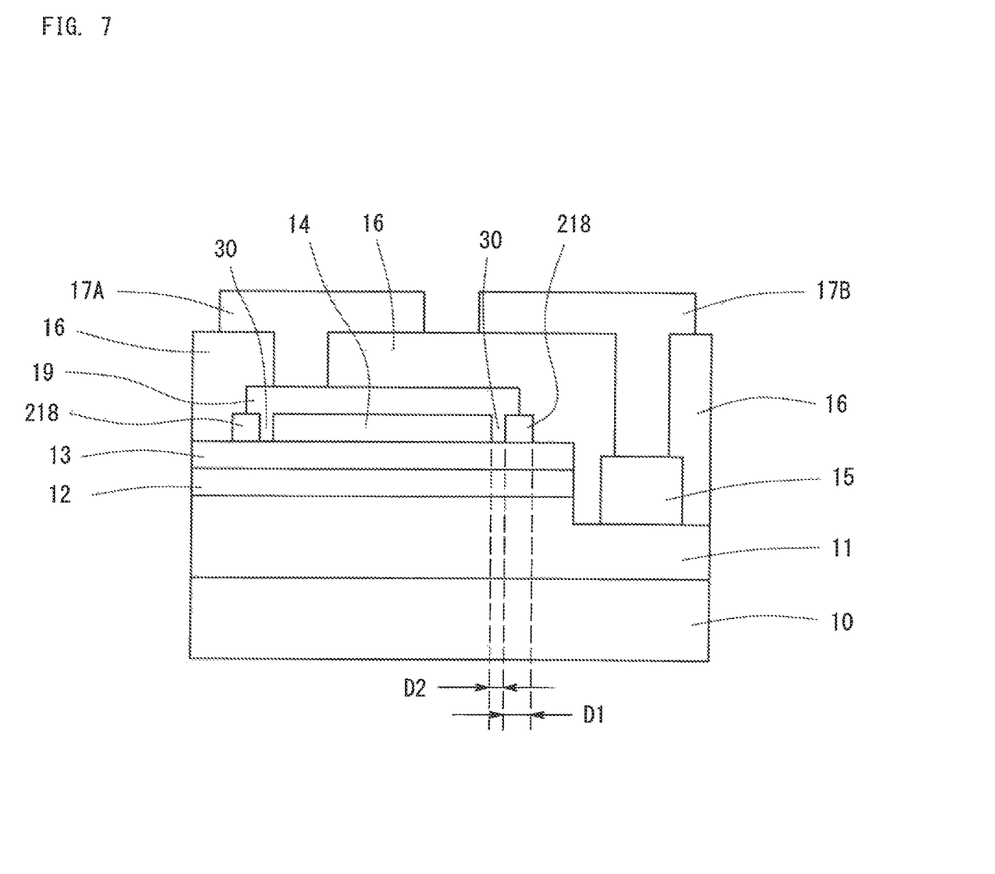
FIG. 7 is a sketch showing the structure of a light-emitting device according to Embodiment 2.

FIG. 7 is a sketch showing the structure of a light-emitting device according to Embodiment 2. In the light-emitting device according to Embodiment 2, an insulating film 218 (i.e., a ring-shaped insulating film) having a ring shape is used in place of the transparent electrode 18 in the light-emitting device according to Embodiment 1. Other structures are the same as in Embodiment 1.

The insulating film 218 is made of $SiO_2$, and has a thickness of 300 nm. Other than $SiO_2$, a transparent insulating material having a refractive index different from that of the p-type layer 13 such as $TiO_2$, $HfO_2$, $Al_2O_3$, $ZrO_2$, $MgF_2$, $LiF$, $CaF_2$, $AlN$, and $Si_3N_4$ may be used. A material having a low refractive index is particularly preferable, for example, a material having a refractive index of 1.8 or less is preferable.

The thickness of the insulating film 218 is not limited to 300 nm. However, the thickness is preferably 50 nm or more to efficiently reflect light. The thickness is preferably 1,000 nm or less to facilitate the production of the device. The thickness of the insulating film 218 may be an odd number of $\lambda/(4n)$ to more efficiently reflect light. The insulating film 218 may be a dielectric multilayer film in which insulators having different refractive indices are alternately deposited to raise the reflectance.

The pattern of the insulating film 218 is preferably the same as the pattern of the transparent electrode 18 in Embodiment 1. That is, the ring-shape of the insulating film 218 may have any pattern, for example, a rectangle, a square, a polygon, a circle, an ellipse or a closed curved line. The insulating film 218 with the ring shape may be continuous or divided into several parts along the circumferential direction. And the pattern is preferably such that the width D1 of the insulating film 218 is 6 μm or less to make the area of the reflective electrode 14 as large as possible. When the width D1 is small, the cover metal layer 19 may protrude outward to come into contact with the p-type layer 13. Therefore, the width D1 is preferably 2 μm or more, more preferably, 3 μm to 5 μm, and further preferably, 3 μm to 4 μm.

In Embodiment 2, a transparent insulating film 218 is used in place of the transparent electrode 18 in Embodiment 1. This can make the difference in refractive index between the insulating film 218 and the p-type layer 13 larger, thereby reflecting more light at an interface between the p-type layer 13 and the insulating film 218.

When the transparent electrode 18 is used as in Embodiment 1, the transparent electrode 18 may come into contact with the reflective electrode 14. However, when the insulating film 218 is used as in Embodiment 2, the space 30 may be provided without bringing the insulating film 218 into contact with the reflective electrode 14. The reflective electrode 14 has low adhesion to the insulating film 218, and the reflective electrode 14 may be peeled off by heat treatment. The width D2 of the space between the insulating film 218 and the reflective electrode 14 is preferably more than 0 μm to not more than 5 μm or less. When the width D2 is larger than 5 μm, the area of the cover metal layer 19 in contact with the p-type layer 13 is enlarged, and light absorption by the cover metal layer 19 cannot be sufficiently reduced. The width D2 is more preferably 3 μm or less, and further preferably 1 μm or less.

The processes for producing a light-emitting device according to Embodiment 2 will next be described. The processes for producing a light-emitting device according to Embodiment 2 are the same as the processes for producing a light-emitting device according to Embodiment 1 except that the formation step and removal step of the transparent film 180 are replaced with the following formation step and removal step of the insulating film.

The insulating film 218 is formed as follows. After the semiconductor layer formation step (step in FIG. 2A) same as in Embodiment 1, an uniform insulating film having a thickness of 300 nm is formed through CVD on the entire surface of the p-type layer 13. Patterning to make a rectangular-shaped insulating film (i.e., a light transmitting film) is performed by forming a resist mask through photolithography and by wet etching using a buffered hydrofluoric acid. The uniform insulating film may be formed by sputtering or vapor deposition other than CVD.

After the resist layer formation step (FIG. 3A), the rectangular-shaped insulating film is wet etched using a buffered hydrofluoric acid. The insulating film 218 with the ring shape is formed in a rectangular ring shape. The etching solution is not limited to the buffered hydrofluoric acid. Any solution may be used as long as it can etch only the insulating film 218 without etching the resist layer 21. For example, an acid-based etching solution may be used.

Through the above, in the light-emitting device according to Embodiment 2, the area of the cover metal layer 19 in contact with the p-type layer 13 in the vicinity of the ends of the reflective electrode 14 can be reduced by forming the insulating film 218 in the vicinity of the ends of the reflective electrode 14, so that light can be reflected at an interface between the insulating film 218 and the p-type layer 13.

Thus, light reaching the cover metal layer 19 is decreased, and light absorption by the cover metal layer 19 is reduced, thereby improving the light extraction efficiency.

In the method for producing a light-emitting device according to Embodiment 2, the reflective electrode 14 is formed on the p-type layer 13 without bringing the resist into contact with a region for forming the reflective electrode 14 on the surface of the p-type layer 13. Therefore, the increase of the contact resistance between the p-type layer 13 and the reflective electrode 14 can be suppressed without causing the residue of resist on the surface of the p-type layer 13.

Variations

Figure 3D:
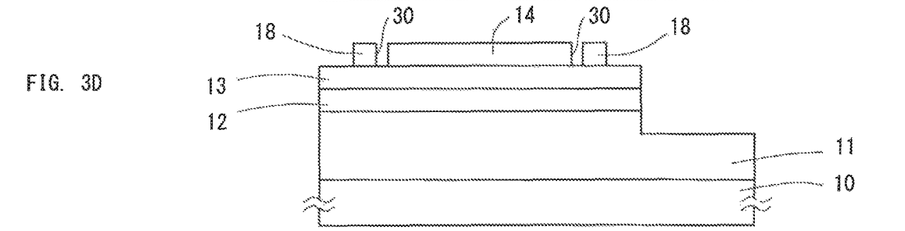
Figure 3E:
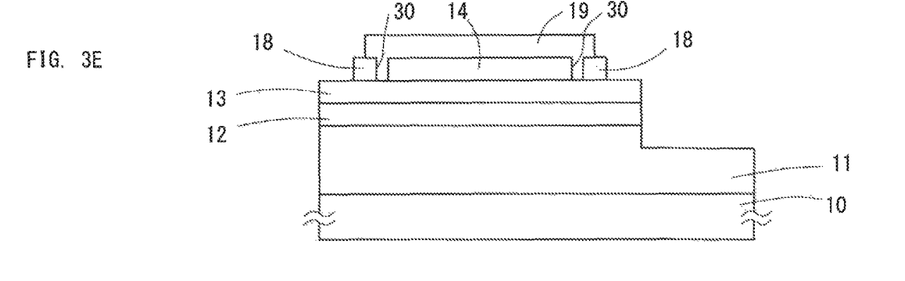

In the methods for producing a light-emitting device according to Embodiments 1 and 2, dry etching is performed to expose the n-type layer 11 as shown in FIG. 2C before the reflective electrode 14 formation step in FIG. 3D after the transparent electrode 18 formation step in FIG. 2B. However, dry etching may be performed to expose the n-type layer 11 after the formation of the reflective electrode 14 in FIG. 3D or the cover metal layer 19 in FIG. 3E. In this case, a restriction is sometimes imposed so as not to affect the reflective electrode 14 or the cover metal layer 19 on the treatment of the resist mask used in dry etching, for example, the type of resist stripper or the post treatment method such as heat treatment and asking after resist removal. As in Embodiments 1 and 2, dry etching is preferably performed to expose the n-type layer 11 before the formation of the reflective electrode 14 because no such restriction is imposed.

To prevent the cover metal layer 19 from coming into contact with the p-type layer 13 in the vicinity of the ends of the reflective electrode 14, the transparent electrode 18 is used in Embodiment 1, and the insulating film 218 is used in Embodiment 2. Any material may be used as long as it is a light transmitting film made of a transparent material having a refractive index different from that of the p-type layer 13. As used herein, "transparent" means optically transparent to emission wavelength. When the p-type layer 13 comprises a plurality of layers, the layer in contact with the light transmitting film of the p-type layer 13 may have a refractive index different from that of the light transmitting film. It is the same when the light transmitting film comprises a plurality of layers. The light transmitting film is preferably made of a material having a refractive index smaller than that of the p-type layer. It is because a part of light obliquely incident on the light transmitting film can be totally reflected. The light transmitting film may be a single layer or a multilayer film. In case of the multilayer film, the DBR (Distributed Bragg Reflector) structure may increase the reflectance.

The light-emitting device of the present invention can be employed as a light source of a display apparatus or an illumination apparatus.

What is claimed is:

1. A method for producing a Group III nitride semiconductor light-emitting device having a reflective electrode on a p-type layer, the method comprising:
    forming a light transmitting film made of a transparent material having a refractive index different from a refractive index of the p-type layer on a region for forming a reflective electrode layer on the p-type layer;
    forming a resist layer with an opening on the p-type layer and the light transmitting film, and exposing the surface of the light transmitting film in the bottom of the opening;

removing the center of the light transmitting film by wet etching, and leaving the ends of the light transmitting film to form a ring-shaped light transmitting film;

forming a reflective film containing Ag or Ag alloy on the p-type layer and the resist layer;

forming the reflective electrode by removing the resist layer along with the reflective film on the resist layer to leave the reflective film on the p-type layer; and forming a cover metal layer on the reflective electrode and the ring-shaped light transmitting film, wherein the ring-shaped light transmitting film is a ring-shaped transparent electrode.

2. The method for producing a Group III nitride semiconductor light-emitting device according to claim 1, wherein the ring-shaped transparent electrode and the reflective electrode are in contact with each other with no space.

3. The method for producing a Group III nitride semiconductor light-emitting device according to claim 1, wherein a space is provided between the ring-shaped light transmitting film and the reflective electrode, and the cover metal layer is in contact with the p-type layer via the space.

4. The method for producing a Group III nitride semiconductor light-emitting device according to claim 1, wherein dry etching is performed to expose the n-type layer before forming the resist layer after forming the light transmitting film.

5. The method for producing a Group III nitride semiconductor light-emitting device according to claim 3, wherein dry etching is performed to expose the n-type layer before forming the resist layer after forming the light transmitting film.

* * * * *